(12) United States Patent
Sakurada et al.

(10) Patent No.: US 6,452,331 B1
(45) Date of Patent: Sep. 17, 2002

(54) PROTECTIVE PLATE FOR A PLASMA DISPLAY AND A METHOD FOR PRODUCING THE SAME

(75) Inventors: Nobuyoshi Sakurada, Tokyo; Toshihiro Ajikata, Kanagawa; Kouichi Osada, Aichi; Ken Moriwaki, Kawasaki; Katsuaki Aikawa; Kazuyoshi Noda, both of Kanagawa; Takuji Oyama, Yokohama, all of (JP)

(73) Assignee: Asahi Glass Company, Ltd., Tokyo (JP)

(*) Notice: Subject to any disclaimer, the term of this patent is extended or adjusted under 35 U.S.C. 154(b) by 0 days.

(21) Appl. No.: 09/276,730

(22) Filed: Mar. 26, 1999

Related U.S. Application Data

(63) Continuation of application No. PCT/JP97/03427, filed on Sep. 26, 1997.

(30) Foreign Application Priority Data

| Sep. 26, 1996 | (JP) | 8-255036 |
| Nov. 22, 1996 | (JP) | 8-327620 |
| Mar. 31, 1997 | (JP) | 9-081251 |

(51) Int. Cl.[7] ............................ B32B 17/06; H01J 17/00
(52) U.S. Cl. ........................ 313/582; 428/432
(58) Field of Search .......................... 313/581, 582, 313/586, 461, 466; 428/426, 432

(56) References Cited

U.S. PATENT DOCUMENTS

| 5,804,102 A | | 9/1998 | Oi et al. | |
| 5,962,974 A | * | 10/1999 | Komaki et al. | 313/582 |
| 6,104,530 A | | 8/2000 | Okamura et al. | |

FOREIGN PATENT DOCUMENTS

| EP | 0 066 745 | | 12/1982 | |
| EP | 0 299 607 | | 1/1989 | |
| EP | 0 545 558 | | 6/1993 | |
| EP | 0 782 164 | | 7/1997 | |
| JP | 62-199999 | | 12/1987 | |
| JP | 63-151989 | | 6/1988 | |
| JP | 63-174777 | | 11/1988 | |
| JP | 1-235195 | | 9/1989 | |
| JP | 5-85783 | | 4/1993 | |
| JP | 5-205669 | * | 8/1993 | 313/582 |
| JP | 5-229052 | | 9/1993 | |
| JP | 7-48527 | | 2/1995 | |
| JP | 7-178866 | | 7/1995 | |
| JP | 8-77832 | | 3/1996 | |
| JP | 8-152502 | | 6/1996 | |
| JP | 9-145918 | | 6/1997 | |
| WO | WO 89/04099 | | 5/1989 | |

* cited by examiner

Primary Examiner—Ashok Patel
(74) Attorney, Agent, or Firm—Oblon, Spivak, McClelland, Maier & Neustadt, P.C.

(57) ABSTRACT

A protective plate for a plasma display includes conductive substrate for protecting a plasma display and an electrode in electrical contact with the conductive substrate.

9 Claims, 8 Drawing Sheets

F I G . 1
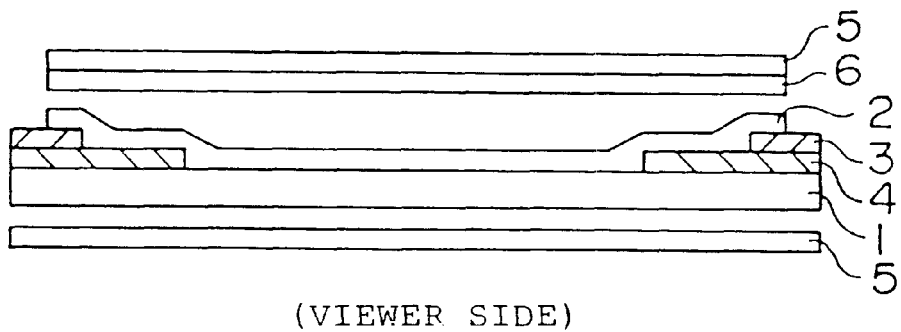

ПРОТECTIVE PLATE FOR A PLASMA DISPLAY AND A METHOD FOR PRODUCING THE SAME

This application is a continuation application of PCT/JP97/03427 filed Sep. 26, 1997.

BACKGROUND OF THE INVENTION

1. Field of the Invention

The present invention relates to a protective plate provided at a front face of a plasma display (hereinbelow, referred to as PDP) to protect the main body of PDP and subjected to a treatment for reducing electromagnetic noises and near infrared rays generated from PDP.

2. Description of the Background

Since a conventional PDP comprises very precise electric components, if it was used as it is and if a user acted on it to apply a force to its surface, there was a high possibility of causing damage. Accordingly, it was necessary to provide protection to prevent the damage.

Further, since PDP generates electromagnetic waves harmful to human body and near infrared rays which causes erroneous operations of remote controllers for various kinds of electrical equipments, there has raised necessity for providing a protective plate having a shielding property to the electromagnetic waves.

It is an object of the present invention to provide a protective plate for PDP provided with a near infrared ray shielding property and an electromagnetic wave shielding property and a method for producing the same.

SUMMARY OF THE INVENTION

The present invention is to provide a protective plate for PDP comprising a conductive substrate for protecting PDP and an electrode in electrical contact with the conductive plate, and a method for producing the same.

In a preferred example of the present invention, there is the above-mentioned protective plate for PDP (hereinbelow, referred to simply as the protective plate) wherein the conductive substrate for protecting PDP comprises a substrate and a conductive film formed on the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 1 is a cross-sectional diagrammatical view of a layer structure as an embodiment of the protective plate of the present invention.

DETAILED DESCRIPTION OF PREFERRED EMBODIMENTS OF THE INVENTION

Figure 2:
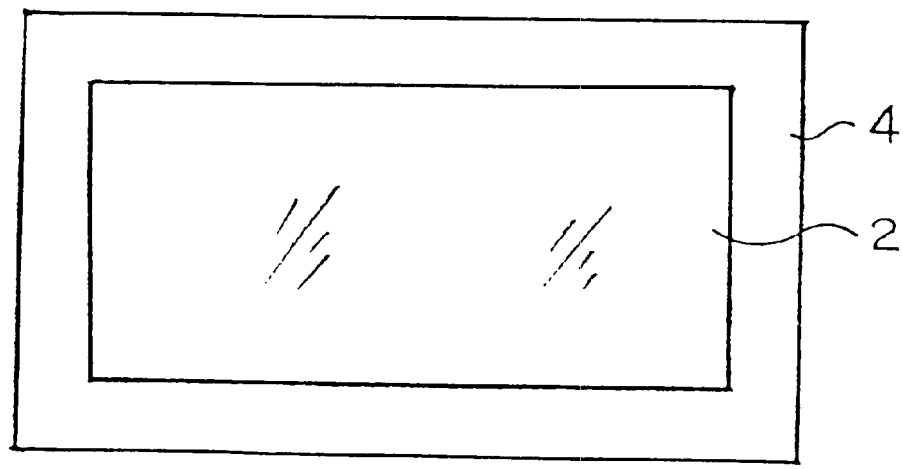
FIG. 2 is a front view of the protective plate according to the embodiment of the present invention viewed from a viewer side.
Figure 3:
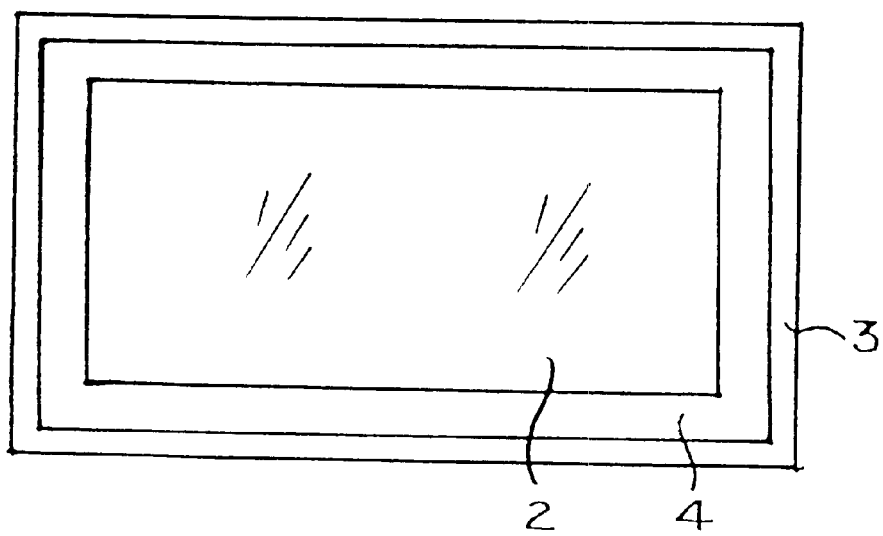
FIG. 3 is a rear side view (a view from a PDP panel side) of the protective plate in FIG. 2.
Figure 4:
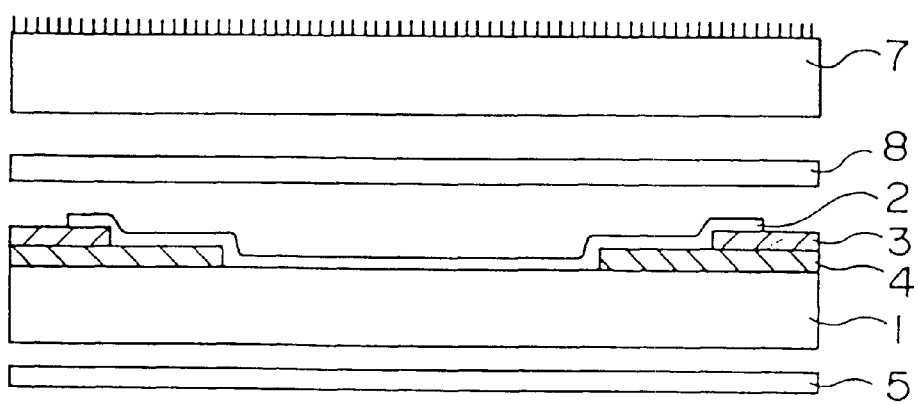
FIG. 4 is a cross-sectional diagrammatical view showing a layer structure as another embodiment of the protective plate of the present invention.
Figure 5:
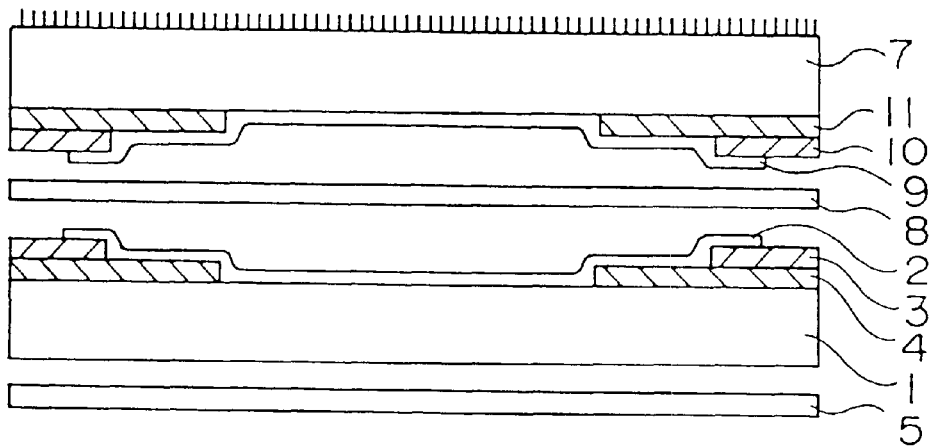
FIG. 5 is a cross-sectional diagrammatical view showing a layer structure as another embodiment of the protective plate of the present invention.

Hereinbelow, the present invention will be described in detail with reference to the drawings. In FIG. 1, reference numeral 1 designates a substrate, numeral 2 a conductive film, numeral 3 an electrode, numeral 4 a colored ceramic layer, numeral 5 a resinous film for preventing scattering and reflecting, and numeral 6 a near infrared ray shielding resinous film. FIG. 2 is a front view of an embodiment of the protective plate of the present invention viewed from an observer side. FIG. 3 is a rear side view (a view viewed from a PDP panel side) of the protective plate in FIG. 2. FIGS. 4 and 5 are cross-sectional diagrammatical views showing the layer structures in other embodiments of the protective plate of the present invention.

As the substrate 1, a glass plate is preferred. As the protective plate, a transparent plastic material has been examined because of being capable of reducing its weight. However, the plastic material had problems that a large warp was resulted and the structure for fitting was very complicated because there was a temperature difference of 40–60° C. between a front surface and the opposing surface at a PDP side whereby the quality as goods was substantially reduced.

Glass is not more than half in thermal expansion coefficient in comparison with the plastic material, and there is no warp due to a temperature difference between the front face and the opposite face at the PDP side. The glass plate is not in particular limited, but it is preferred from the standpoint of safety to use a strengthened glass provided with a strengthened layers at its front surface which can prevent the breakage in comparison with glass without subjected to a strengthening treatment or to use a strengthened glass by quenching because broken pieces are small even if the breakage occurs and the edges are unlike sharp cutters. The substrate 1 may have a film for preventing reflection.

The resistance value of the protective plate of the present invention is preferably within 1.0–3.5 Ω/□, in particular, 1.5–3.0 Ω/□, and further, 1.5–2.5 Ω/□.

The conductive film 2 may be a single layer transparent conductive film such as, for example, a film comprising zinc oxide as the main component (e.g. an aluminum-doped zinc oxide film), a film comprising indium-zinc oxide (ITO) as the main component, a film comprising tin oxide as the main component.

In particular, it is preferable to use a multi-layer film as the conductive film wherein an oxide layer, a metal, an oxide layer are alternately laminated on the substrate 1 to form in total (2n+1) layers (n is an integer of at least 1) because a low sheet resistance, a low reflectance, and a high visible light transmittance can be obtained.

The oxide layer may be a layer comprising at least one metal oxide selected from the group consisting of Bi, Zr, Al, Ti, Sn, In and Zn as the main component. More preferably, it is a layer comprising at least one metal oxide selected from the group consisting of Ti, Sn, In and Zn as the main component. In particular, it is preferable to use a layer comprising ZnO as the main component because it has a low absorptance and a refraction index of about 2. Further, a layer comprising $TiO_2$ as the main component is preferred because it has a large refraction index and it can provide a preferred color tone with a small number of layers.

The oxide layer may be constituted by a plurality of thin oxide layers. For example, it may be formed by a layer comprising $SnO_2$ as the main component and a layer comprising ZnO as the main component instead of the oxide layer comprising ZnO as the main component.

The metal layer is preferably a layer comprising at least one metal oxide as the main component selected from the group consisting of Au, Ag and Cu. In particular, a metal layer comprising Ag as the main component is preferred because of its having small specific resistance and absorption.

The oxide layer comprising ZnO as the main component is preferably an oxide layer comprising Zno containing at least one metal other than Zn. The at least one metal contained exits in a state of oxide in the oxide layer.

ZnO containing at least one metal may be ZnO containing at least one selected from the group consisting of Sn, Al, Cr, Ti, Si, B, Mg and Ga.

The proportion of the total amount of the at least one metal is preferably within 1–10 atomic % based on the sum of the total amount of the metal and Zn because the moisture resistance of the conductive film obtained is increased.

If the proportion is less than 1 atomic %, the internal stress of the ZnO film is not sufficiently reduced, and the degree of adhesion between the ZnO film and the Ag layer does not show substantial improvement, as the result of which the moisture resistance is not improved. Further, if the proportion exceeds 10 atomic %, the moisture resistance is again reduced because it is considered that when the proportion of the metal contained is much, the crystallization of ZnO is lowered whereby the harmony with Ag is lowered. In the consideration of obtaining the ZnO film of low internal stress stably and with good reproducibility in addition to the crystallization of ZnO, it is preferable that the proportion of the metal is within 2–6 atomic %.

The metal layer comprising Ag as the main component is preferably a metal layer comprising Ag containing Pd and/or Au because it controls the scattering of Ag as a result of improving the moisture resistance.

The proportion of Pd and/or Au is preferably within 0.3–10 atomic % based on the sum of the total amount of Pd and/or Au and Ag.

If the proportion is less than 0.3 atomic %, function for stabilizing Ag is lowered. If it exceeds 10 atomic %, the function for stabilizing is again lowered. In a range of not more than 10%, the moisture resistance is increased as an amount to be added is more. However, if the amount to be added is more, the film forming rate is reduced, the visible light transmittance is reduced and the emissibility is increased. Accordingly, it is proper that the amount to be added is not more than 5.0 atomic % from the above-mentioned points. Further, when the amount to be added is increased, the target cost is remarkably increased. Accordingly, the proportion should be in a range of about 0.5–2.0 atomic % in considering generally necessary moisture resistance.

The multi-layer film formed on the substrate 1 by laminating alternately an oxide, a metal, an oxide to form (2n+1) layers (n is an integer of at least 1) may be a multi-layer film such as 3 layers, 5 layers, 7 layers or 9 layers. In particular, it is preferable to form a multi-layer conductive film laminated by 7 layers or more. Since 7 layers or 9 layers can reduce the resistance value sufficiently and provide a near infrared ray shielding property, the before-mentioned near infrared ray shielding resinous film 6 can be eliminated.

The geometrical film thickness (hereinbelow, referred to simply as the film thickness) of the oxide layer is preferably such that the oxide layer closest to the substrate and the oxide layer remotest from the substrate has 20–60 nm (in particular, 30–50 nm) and the oxide layer other than the above has 40–120 nm (in particular, 40–100 nm).

The total film thickness of the metal layers is preferably such that when the target of the resistance value of the protective film to be obtained is 2.5 Ω/□ for example, 25–40 nm (in particular, 25–35 nm), and when the target of the resistance value is 1.5 Ω/□, the thickness be 35–50 nm (in particular, 35–45 nm). The total film thickness is properly distributed to a number of metal layers. When the number of the metal layers is increased, the specific resistance of the metal layers is increased. Accordingly, the total film thickness tends to be increased as the result of reducing the resistance.

The ground total film thickness of the oxide layers and the metal layers is such that for example, when the number of the metal layers is 2, it has 150–190 nm (particularly 160–180 nm); when the number of the metal layers is 3, it has 230–330 nm (particularly, 250–300 nm); and when the number of the metal layers is 4, it has 270–370 nm (particularly, 310–350 nm).

As a concrete example of the 7 layer conductive film, there is a multi-layer film formed by laminating from a substrate side an oxide layer comprising a first ZnO as the main component (the first layer), a metal layer comprising a first Ag as the main component (the second layer), an oxide layer comprising a second ZnO as the main component (the third layer), a metal layer comprising a second Ag as the main component (the fourth layer), an oxide layer comprising a third ZnO as the main component (the fifth layer), a metal layer comprising a third Ag as the main component (the sixth layer), and an oxide layer comprising a fourth ZnO as the main component (the seventh layer) in this order. With such construction, a preferred color tone (without having a red tone) when viewed from an observer side is provided.

The film thickness of the oxide layers is properly adjusted so as to satisfy required optical properties from such ranges of 20–60 nm (preferably, 30–50 nm, more preferably, 40–50 nm) for the first oxide layer, 8–13 nm (preferably, 9–11 nm) for the first metal layer, 60–100 nm (preferably, 70–90 nm) for the second oxide layer, 9–15 nm (preferably, 10–12.5 nm) for the second metal layer, 40–100 nm (preferably, 70–90 nm) for the third oxide layer, 8–13 nm (preferably, 9–11 nm) for the third metal layer and 20–60 nm (preferably, 30–50 nm) for the fourth oxide layer.

As described before, in the present invention, various kinds of resinous film can be useful. Here, a multi-layer conductive film having such a structure (as an example of 7 layers) comprising oxide layer (40 nm)-metal layer (10 nm)-oxide layer (80 nm)-metal layer (10 nm)-oxide layer (80 nm)-metal layer (10 nm)-oxide layer (40 nm) is called a conductive film of "typical structure" (namely, the film thickness of each metal layer is equal and a thick oxide layer has a film thickness as twice as a thin oxide layer). In the present invention, when a multi-layer conductive film laminated into (2n+1) layers (n is an integer of at least 1) and a resinous film having a refractive index of 1.5–1.6 are used, it is preferable to adjust the film thickness of the oxide layer and/or the metal layer and to use a conductive film of non-typical structure without using "typical structure" whereby a desired color tone is obtainable. Particularly, when a layer made of material having a refractive index of about 2.0 (for example, a layer comprising ZnO as the main component) is used for the oxide layer, it is preferred to have a non-typical structure.

For example, in a case of a 7 layer conductive film by which desired color tone and low reflection property can be obtained, it is preferred that the film thicknesses of the second oxide layer (the third layer) and the third oxide layer (the fifth layer) are 70–200%, particularly, 80–150% of the film thicknesses of the first oxide layer (the first layer) and the fourth oxide layer (the seventh layer). Further, it is preferable that the film thickness of the second metal layer (the fourth layer) is 80–150%, particularly, 90–110%, further, 95–105% of the film thickness of the first metal layer (the second layer) and the third metal layer (the sixth layer).

More specifically, A) for the reason that a low reflection region can be broadened, it is preferable that the film thickness of the second metal layer (the fourth layer) is thinner than the film thickness of the first metal layer (the second layer) and is thinner than the film thickness of the third metal layer (the sixth layer). More concretely, it is preferable that the film thicknesses of the first and third metal layers are made equal, and the film thickness of the second metal layer is made 80–95%, particularly, 90–95% of the film thickness of the first and third metal layers.

Further, B) for the reason that a low reflection portion in a reflection curve can further be flattened, it is preferable that the film thickness of the second metal layer (the fourth layer) is thicker than the film thickness of the first metal layer (the second layer) and is thicker than the film thickness of the third metal layer (the sixth layer). More concretely, it is preferable that the film thicknesses of the first and third metal layers are made equal, and the film thickness of the second metal layer is made 105–150%, particularly, 110–130%, further, 110–115% to the film thickness of the first and third metal layers (practically, it is thickened by 1–5 nm).

Further, C) from the reason that a low reflection region can be broadened, it is preferable that the film thicknesses of the second oxide layer (the third layer) and the third oxide layer (the fifth layer) are made thin with respect to two times of the film thickness of the first oxide layer (the first layer) and the fourth oxide layer (the seventh layer). More concretely, it is preferably 70–95%, further, 80–95% as much as the film thickness of the first and seventh oxide layers (practically, it is thinned by 1–10 nm).

Further, D) from the reason that a low reflection portion in the reflection curve can be further flattened, it is preferable that the film thicknesses of the second oxide layer (the third layer) and the third oxide layer (the fifth layer) are made thicker with respect to two times of the film thickness of the first oxide layer (the first layer) and the fourth oxide layer (the seventh layer). Specifically, it is preferred to form the oxide layers to be 105–150% of the first and seventh oxide layers. In this case, the metal layers should be adjusted to as the above-mentioned A).

With the non-typical structure as described above, the reflectance spectrum can be flattened and the visual reflectivity can be low even though the resinous film is used. The reduction of the visual reflectivity is preferably conducted by adjusting the film thickness of the oxide layer rather than the adjustment of the film thickness of the metal layer.

In the present invention, it is preferred to form a separate layer for preventing the metal layer from being oxidized in forming the oxide layer (hereinbelow, referred to as an oxidation barrier layer) between the first metal layer and the second oxide layer, between the second metal layer and the third oxide layer and between the third metal layer and the fourth oxide layer.

The oxidation barrier layer may be a metal layer, an oxide layer or a nitride layer. Specifically, a layer comprising at least one metal selected from the group consisting of Al, Ti, Si, Ga and Zn, or oxide or nitride of the metal. Preferably, Ti or ZnO containing Si and Ga is used.

A desired film thickness of the oxidation barrier layer is 1–7 nm. If it is thinner than 1 nm, it does not show a sufficient effect as a barrier layer. If it is thicker than 7 nm, the transmittance of the film is reduced.

Figure 7:
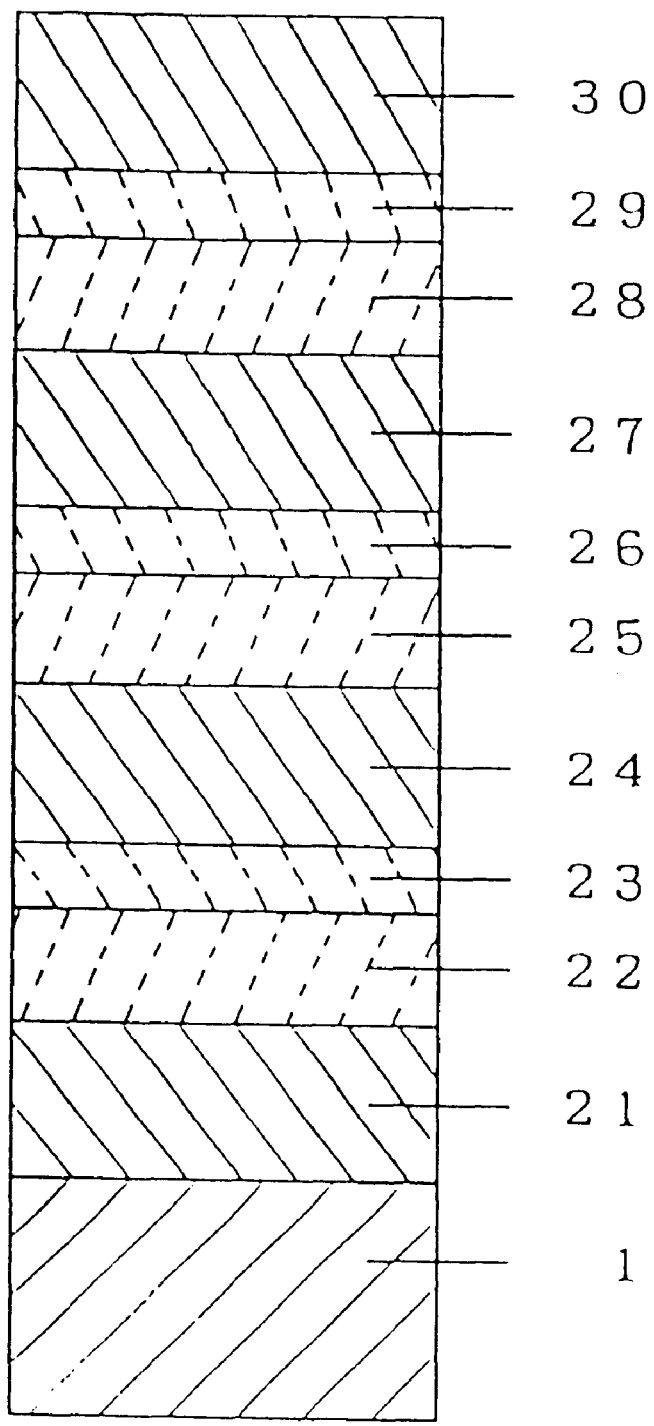
FIG. 7 is a cross-sectional view of an embodiment of a conductive film formed on a substrate according to the present invention.

FIG. 7 is a cross-sectional view of an embodiment of a conductive film formed on a substrate according to the present invention wherein reference numeral 1 designates a substrate, numerals 21, 24, 27 and 30 designate oxide layers, numerals 22, 25 and 28 metal layers, and numerals 23, 26 and 29 oxidation barrier layers.

In the present invention, it is preferred to use an oxide layer comprising ZnO containing therein Al or Sn and a metal layer comprising Ag containing Pd.

The oxide layer comprising ZnO containing Al or Sn is well harmonized with the metal layer comprising Ag containing Pd. A combination of both layers improves remarkably the moisture resistance.

In particular, Al is inexpensive and provides a high film forming rate of ZnO after having been contained. Further, the oxide layer comprising ZnO containing Al is more harmonized with the metal layer comprising Ag containing Pd.

The reason may be from the fact that the crystalline structure of Al is the same as that of Ag or Pd. Accordingly, even in a case that Al is deposited on the grain foundary or the interface of ZnO, it may be well matched at the interface with Ag or Pd in an atomic level.

Although the presence of Pd stabilizes Ag, the resistance value will increase in comparison with that of pure Ag. On the other hand, a rising portion of the spectral reflectance curve at a long wavelength side is related to the resistance value. A high resistance value provides a mild rising portion, as a result of which it is advantageous in a change of the color tone of reflection in response to an incident angle.

In the present invention, it is preferred to provide an oxide film or a nitride film or the like on the conductive film 2 (the outermost layer). The outermost layer is used as a protective layer for protecting the conductive film 2 (particularly, a conductive film containing Ag) from moisture and as a protective layer for protecting the oxide layer of the conductive film 2 (in particular, a layer comprising ZnO as the main component) from an adhesive agent (in particular, an alkali type adhesive agent) used when the resinous film 5 for preventing scattering and reflecting or the resinous film 6 for shielding near infrared rays is bonded. Specifically, the layer is an oxide film or a nitride film of metal such as Zr, Ti, Si, B or Sn.

In particular, a nitride film is preferably used in a case that a layer comprising ZnO as the main component is used as the uppermost layer on the conductive film 2. The nitride film may be a nitride film of Zr and/or Si, in particular, it is preferred to use a composite nitride film of Zr and Si.

The protective layer is preferably formed with a film thickness of 5–30 nm, particularly, 5–20 nm.

The conductive film 2 is formed to be in contact with the electrode 3 and is grounded. The method for forming the conductive film 2 is not limited, for example, a sputtering method is preferably used.

The electrode 3 should be in electrical contact with the conductive film 2 so that the electromagnetic shielding effect to the conductive film 2 can be performed, and is not in particular limited. Further, the electrode having a low resistance is excellent in terms of an electromagnetic shielding performance. For example, the electrode coated with an Ag paste (a paste containing Ag and glass frit) or a Cu paste (a paste containing Cu and glass frit) followed by baking is preferably used.

The electrode 3 is preferably arranged in the entire periphery of the substrate, as shown in FIG. 3, in order to assure the electromagnetic shielding effect of the conductive film 2. As shown in FIGS. 1 and 2, a colored ceramic layer 4 is preferably formed between the electrode 3 and the substrate so that the electrode 3 is shielded to prevent the electrode from being directly viewed from an observer side. The colored ceramic layer 4 may be formed at an observer side with respect to the substrate 1 but not at a PDP side to the substrate 1. In this case, a copper tape with a conductive sticking agent may be attached, as an electrode, after the conductive film 2 is directly formed on the substrate 1.

It is preferred to provide a resinous film at a front side (a viewer side) of the substrate 1 and/or a rear side (a PDP side) of the substrate 1 to prevent the scattering of the protective plate itself. In particular, use of an urethane type film having a self-repairing property which repairs itself when a flaw is formed on it and a scattering preventing property provides a preferable result.

Further, it is preferred to provide a resinous film of low refractive index for preventing reflection at a front side (a viewer side) of the substrate 1 and/or a rear side (a PDP side) of the substrate 1. In particular, use of a fluorine resin type film provides a preferable result. The resinous film of low refractive index may be a colored film for adjusting the color tone.

The visible light reflectivity of the protective plate of the present invention is preferably less than 6%, particularly, less than 3%. If the visible light reflectivity is not less than 3% and less than 6%, the color tone of reflection light is preferably within 0.15<x<0.40, 0.15<y<0.40 (particularly, 0.25<x<0.35 and 0.20<y<0.35) in terms of a color tone expressing method by CIE. If the visible light reflectivity is less than 3%, the color tone of reflection light is preferably within 0.10<x<0.50, 1.10<y<0.50 (particularly, 0.20<x<0.40 and 0.10<y<0.40). Here, a symbol x represents a proportion of red color component and a symbol y represents a proportion of green color component.

From the viewpoint of preventing the scattering of the protective plate itself and for preventing reflection, it is preferable to use ARCTOP (tradename) manufactured by Asahi Glass Company Ltd.

ARCTOP (tradename) comprises a polyurethane type flexible resinous film having a self-repairing property and a scattering preventing property and an anti-reflection layer of low refractive index which is made of a fluorine-containing polymer having a non-crystallization property which is formed on a side of the resinous film, as an anti-reflection treatment. As the resinous film 5 for preventing scattering and reflection shown in FIGS. 1, 4 and 5, the ARCTOP (tradename) can preferably be used.

From the reason that the reflectivity of the protective plate obtained can be lowered and a desired color of reflection light can be obtained, it is preferable that the anti-reflection layer itself exhibits the lowest reflectivity in a wavelength of 500–600 nm, particularly, 530–590 nm in a visible light region.

The resinous film 6 for shielding near infrared rays (for example, a resinous film mixed with a near infrared ray absorbing agent) may be provided on a front surface (a viewer side) of the substrate 1 and/or a rear surface (a PDP side) of the substrate. Or, when the resinous film 5 for preventing scattering and reflection (particularly, the above-mentioned ARCTOP) is used in the present invention, a infrared ray absorbing agent may be mixed in a polyurethane type flexible resinous film so that the resinous film 5 for preventing scattering and reflection has a near infrared ray shielding effect. Although the protective film of the present invention can shield near infrared rays by means of the conductive film 2, the presence of such resinous film can further improve the shielding effect.

In FIG. 1, the reason why the conductive film 2, the resinous film 6 and the resinous film 5 are provided excluding their both ends is to form a terminal for grounding the electrode 3 in this portion. It is preferred that a number of ground terminals are provided in the entire periphery of the protective plate so that the ground resistance is reduced and a high electromagnetic shielding effect can be maintained. Accordingly, the electrode 3 is preferably exposed over the entire periphery in the edge portions of the protective plate (i.e., it is not covered with the conductive film 2) as shown in FIGS. 1 and 3. FIG. 3 does not show the resinous film 5 and the resinous film 6. However, it is preferred that they cover the conductive film 2 entirely to protect the conductive film 2 and leave the exposed portion of the electrode 3 over the entire periphery. Namely, the edge portions of the resinous film 5 and the resinous film 6 are preferably at a side near the edge portions of the substrate 1 rather than the edge portions of the conductive film 2 and a side near the center of the substrate 1 rather than the edge portions of the electrode 3 in their entire periphery.

Further, as shown in FIG. 4, a separate substrate 7 can be laminated on a rear surface (a PDP side) of the substrate 1 by interposing a resinous film (interlayer) 8. For example, it is possible to laminate with another glass substrate by interposing a resinous interlayer 8 such as polyvinylbutyral or EVA by using a method for forming a lamination glass. Such lamination glass can provide an anti-scattering effect by means of the interlayer 8. Or, it is possible to laminate by bonding the substrate 1 and the substrate 7 with an adhesive having excellent transparency.

In the example shown in FIG. 4, an anti-reflection treatment is applied to an outer surface of the separate substrate 7 (in FIGS. 4 or 5, the treatment is indicated by a comb-like mark on the substrate 7). The anti-reflection treatment may be by a method for forming a film of low refractive index such as a porous silica film (a silica film is made porous to reduce the refractive index). Further, in the example of FIG. 4, the above-mentioned ARCTOP (tradename) as the resinous film 5 for preventing scattering and reflection is bonded to an outer surface of the substrate 1 (bonding is conducted with the anti-reflection film of ARCTOP directing outside (to be exposed)). In this case, the presence of the interlayer 8 prevents the scattering. Accordingly, an anti-reflection treatment may be conducted directly onto an outer surface of the substrate 1 by means of a method for forming a film of low refractive index, instead of using the film 5.

An outer surface of the separate substrate 7 may be subjected to an anti-reflection treatment, besides using the method of forming a film of low refractive index such as the above-mentioned porous silica film, by bonding the resinous film 5 for preventing scattering and reflection so that the anti-reflection film is directed outside (exposed).

Further, as shown in FIG. 5, a conductive film 9 which is the same as the above-mentioned conductive film 2 and an electrode 10 are formed on the separate substrate 7 to increase further the electromagnetic wave shielding property and the near infrared ray shielding property (although a colored ceramic layer 11 is formed in FIG. 5, it may not be provided unless the electrode 10 can be viewed from an observer side by the presence of the colored ceramic layer 4). In this case, the attachment of the ground terminals can be conducted such that a conductive tape (not shown) is provided extending from the substrate over the entire periphery from a portion where the electrode 3 and the electrode 10 are not covered with the conductive film (i.e., they are exposed), and then, lamination glass processing is conducted.

In the example of FIG. 5, the anti-reflection treatment is conducted in the same manner as in FIG. 4, in the rear surface (a PDP side) of the separate substrate 7. However, it is possible that the resinous film for preventing scattering and reflection which is described before, is provided so that the anti-reflection layer faces outside (to be exposed). Further, in the example of FIG. 5, the above-mentioned ARCTOP (tradename) as the resinous film for preventing scattering and reflection, is bonded to the outer surface of the substrate 1 in the same manner as in FIG. 4. However, the anti-reflection treatment may be conducted directly to the outer surface of the substrate 1 by means of the method for forming a film of low refractive index. Further, a film for shielding near infrared rays may be provided on the protective plate as shown in FIGS. 4 and 5.

FIGS. 1, 4 and 5 are cross-sectional diagrammatical views for showing the layer structure according to embodiments of the protective plate of the present invention. In fact, the protective plate of the present invention is formed by unifying these layers wherein the resinous film 5 and the resinous film 6 are bonded to the substrate 1 (including a case of the substrate having its surface on which the conductive film 2 or the electrode 3 are formed). The adhesive may be an acryl type or acryl modified type self-adhesive. In particular, an acryl type self-adhesive is preferably used because excellent moisture resistance is obtainable. Further, as described before, the substrate 1 and the substrate 7 (each including a case of the substrate having its surface on which the conductive film or the electrode is formed) in FIGS. 4 and 5 are press-bonded by interposing the interlayer 8 to be unified as the lamination glass.

The protective plate of the present invention is disposed on a front face of PDP. Accordingly, the visible light transmittance is preferably not less than 50% to assure the transparency of the display.

In the following, description will be made as to another embodiment of the protective plate for PDP according to the present invention. As described before, it is necessary that the protective plate for PDP satisfies the property of shielding electromagnetic waves emitted from PDP (accordingly, it should have a high conductivity and low sheet resistance), the property of shielding near infrared rays emitted from PDP and the properties of a high transmittance and anti-reflection and so on.

Several ways can be taken to provide the electromagnetic wave shielding property such as a method for forming a conductive layer directly on the substrate by using a sputtering or the like, a method for bonding on the substrate a conductive film obtained by forming a conductive film on a resinous film, and a method for embedding in the substrate a conductive film comprising a conductive mesh.

Several ways can be taken to provide the infrared ray shielding property such as a method for providing a near infrared ray shielding resinous film, a method for using a near infrared ray absorbing substrate, a method for using a self-adhesive added with a near infrared ray absorber at the time of the laminating of the films, a method for adding a near infrared ray absorber into an anti-reflection film or the like to provide a near infrared ray absorbing function, or a method for using a conductive film having a near infrared ray reflecting function.

Several ways can be taken to provide the anti-reflection property such as a method for bonding an anti-reflection film having an anti-reflection layer on the resinous film or a method for forming an anti-reflection layer directly on the substrate.

Figure 8:
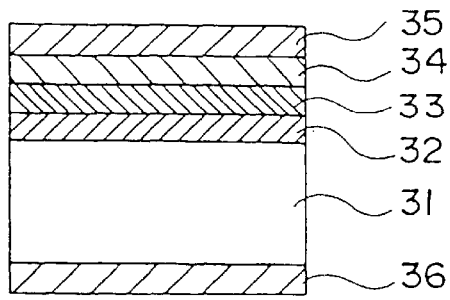
FIG. 8 is a cross-sectional diagrammatical view of an embodiment of the protective plate for PDP of the present invention.

FIG. 8 is a cross-sectional diagrammatical view of an embodiment of the protective plate for PDP of the present invention in which film materials having each of the properties are laminated to satisfy these properties.

Reference numeral 31 designates a substrate for protecting PDP, which made of glass, (including a cooled air strengthened glass or a chemically strengthened glass) or plastics (polymethylmethacrylate, polycarbonate, polystyrene or the like) in the same manner as the substrate 1 in FIGS. 1 to 5.

Numeral 32 designates a conductive layer having an electromagnetic wave shielding property, which is the same as the conductive film 2 in FIGS. 1 to 5. It may be formed directly on the substrate 31 by a sputtering method or the like, may be bonded on the substrate 31 a conductive film on which a conductive film is formed on a resinous film such as PET (polyethylene terephthalate) or the like.

Numeral 33 designates a moisture-resistant film to prevent the deterioration of the conductive film due to moisture. Material for it may be PET, polyvinylidene chloride or the like.

The moisture-resistant film 33 is provided when a moisture-resistant treatment is necessary for the conductive layer 32 (for example, the conductive film is a multi-layer film including Ag). However, such moisture-resistant film 33 is unnecessary in a case that the conductive layer 32 comprises a conductive film formed on a PET film and such conductive film is bonded between the substrate 31 and the PET film.

Numeral 34 designates a near infrared ray shielding resinous film which is the same as the infrared ray shielding resinous film 5 in FIGS. 1 to 5. This film may be a resinous film of PET or the like on which a coating including a near infrared ray absorber is applied or a resinous film of PET or the like with which a near infrared ray absorber is mixed.

Numeral 35 designates an anti-reflection film which is the same as the resinous film 5 for preventing scattering and reflection in FIGS. 1 to 5, and which is obtainable by forming an anti-reflection layer on a resinous film made of urethane, PET or the like (which possesses an anti-scattering function) so as to conduct an anti-reflection treatment. The anti-reflection layer may be a layer of low refractive index comprising a fluorine-containing polymer of non-crystallization (e.g., "Cytop" manufactured by Asahi Glass Company Ltd.), a layer formed of a film of low refractive index such as $SiO_2$ or $MgF_2$, or a multi-layer comprising alternate lamination of a film of low refractive index and a film of high refractive index by vapor deposition or sputtering, a porous silica film or the like.

The anti-reflection layer is formed on a resinous film at the opposite side with respect to the substrate 31 (i.e., so as to expose the anti-reflection layer). As described above, ARCTOP by Asahi Glass Company Ltd. is preferably used as such anti-reflection film 35.

Numeral 36 designates an anti-reflection film (which is the same as the anti-reflection film 35) or a layer subjected to an anti-reflection treatment (an anti-reflection layer formed directly on the substrate 31 (the anti-reflection layer is the same as the anti-reflection layer in the anti-reflection film 35)).

Figure 9:
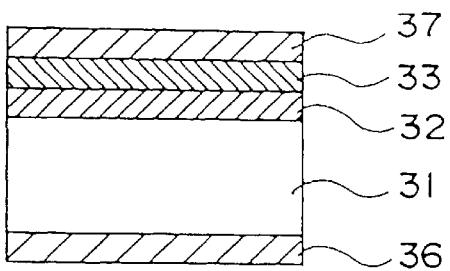
FIG. 9 is a cross-sectional diagrammatical view of an embodiment of the protective plate for PDP of the present invention.

FIG. 9 is a cross-sectional diagrammatical view of another embodiment of the protective plate for a plasma display according to the present invention. In this embodiment, the infrared ray shielding resinous film 34 and the anti-reflection film 35 in FIG. 8 are replaced by a near infrared ray shielding, anti-reflection film 37. Such infrared ray shielding anti-reflection film 37 may be such one that a near infrared ray absorber is mixed into a resinous film in the anti-reflection film 35.

Figure 10:
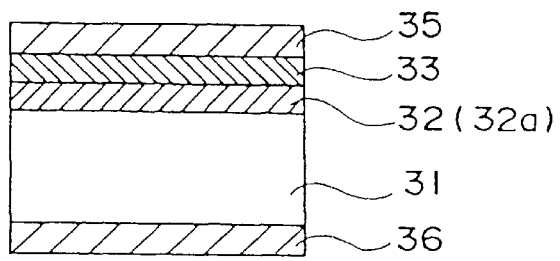
FIG. 10 is a cross-sectional diagrammatical view of an embodiment of the protective plate for PDP of the present invention.

FIG. 10 is a cross-sectional diagrammatical view showing another embodiment of the protective plate for PDP of the present invention. In this embodiment, the near infrared ray shielding function of the near infrared ray shielding resinous film 34 in FIG. 8 is accomplished by a conductive layer 32a having a near infrared ray reflecting function.

As the conductive layer 32a having the near infrared ray reflecting function, there is a conductive layer formed by laminating alternately an oxide, a metal, an oxide into (2n+1) layers (in particular, a conductive layer having n of at least 3) as described as to the conductive film 2 in FIGS. 1 to 5.

Figure 11:
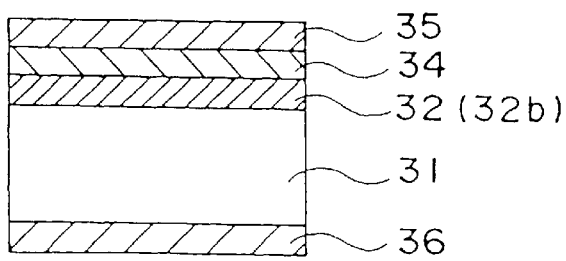
FIG. 11 is a cross-sectional diagrammatical view of an embodiment of the protective plate for PDP of the present invention.

FIG. 11 is a cross-sectional diagrammatical view of another embodiment of the protective plate for PDP of the present invention. In this embodiment, a conductive layer 32b having a moisture-resistant property is provided as the conductive layer 32 whereby the moisture-resistant film 33 in FIG. 8 can be eliminated. As the conductive layer 32b having a moisture-resistant property, there is 1) a conductive layer formed by bonding an electrically conductive film comprising a resinous film such as PET or the like having a moisture-resistant property on which a conductive film is formed so that the conductive film is located between the substrate 31 and the resinous film, or 2) a conductive film having a moisture-resistant property even when the conductive film is formed directly on the substrate 31 by means of a sputtering method or the like (for example, as described as to the conductive film 2 in FIGS. 1 to 5, metal such as Sn, Al, Cr, Ti, Si, B, Mg, Ga and so on is contained in ZnO, or Pd or Au is contained in Ag, or an oxide film or a nitride film comprising Zr, Ti, Si, B and so on is formed on the uppermost layer to improve the moisture-resistant property of the conductive film).

When the conductive layer 32 is not the conductive layer 32b having a moisture-resistant property and if the near infrared ray shielding resinous film 34 is of PET containing a near infrared ray absorber, the moisture-resistant film 33 in FIG. 8 becomes unnecessary because PET has a moisture-resistant property (PET including a near infrared ray absorber functions as the moisture-resistant film 33).

Figure 12:
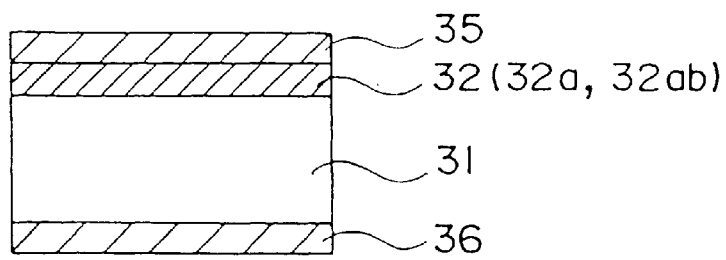
FIG. 12 is a cross-sectional diagrammatical view of an embodiment of the protective plate for PDP of the present invention.

FIG. 12 is a cross-sectional diagrammatical view of another embodiment of the protective plate for PDP of the present invention. In this embodiment, the moisture-resistant film 33 in FIG. 10 becomes unnecessary. The elimination of the moisture-resistant film becomes possible in a case that 1) the conductive layer 32a having a near infrared ray reflecting function in FIG. 10 has a moisture-resistant property (namely, it functions as the conductive layer 32a having a near infrared ray reflecting function and the conductive layer 32b having a moisture-resistant property), or 2) the anti-reflection film 35 comprises PET on which an anti-reflection layer is formed even though the conductive layer 32a having a near infrared ray reflecting function does not have a moisture-resistant property.

Figure 13:
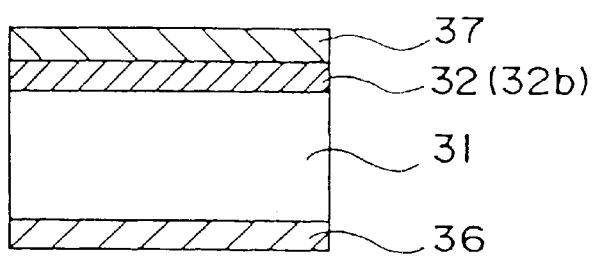
FIG. 13 is a cross-sectional diagrammatical view of an embodiment of the protective plate for PDP of the present invention.

FIG. 13 is a cross-sectional diagrammatical view of another embodiment of the protective plate for PDP of the present invention. In this embodiment, the moisture-resistant film 33 in FIG. 9 becomes unnecessary. The elimination of the moisture-resistant film becomes possible in a case that 1) the conductive layer 32 in FIG. 9 is the conductive layer 32b having the above-mentioned moisture-resistant property, or 2) the near infrared ray shielding anti-reflection film 37 comprises PET mixed with a near infrared ray absorber on which an anti-reflection layer is formed even though the conductive layer 32 does not have a moisture-resistant property.

Figure 14:
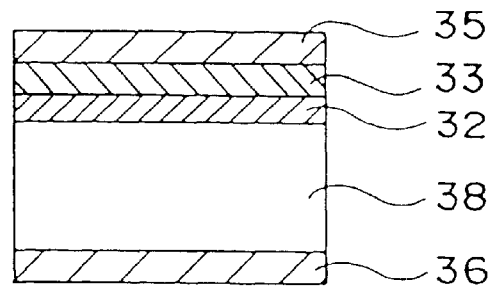
FIG. 14 is a cross-sectional diagrammatical view of an embodiment of the protective plate for PDP of the present invention.

FIG. 14 a cross-sectional diagrammatical view of another embodiment of the protective plate for PDP of the present invention. In this example, the near infrared ray shielding function of the near infrared ray shielding resinous film 34 in FIG. 8 is accomplished by a near infrared ray absorbing substrate 38 instead. As the near infrared ray absorbing substrate 38, there is such one that a near infrared ray absorber is added to polycarbonate or acryl.

Figure 15:
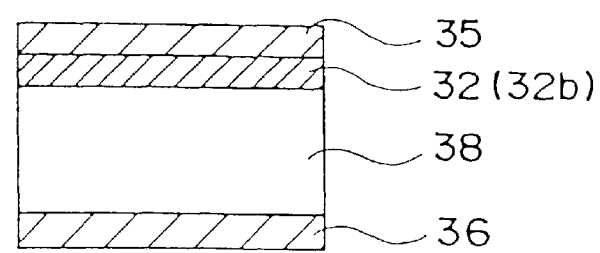
FIG. 15 is a cross-sectional diagrammatical view of an embodiment of the protective plate for PDP of the present invention.

FIG. 15 is a cross-sectional diagrammatical view of another embodiment of the protective plate for PDP of the present invention. In this embodiment, the moisture-resistant film 33 in FIG. 14 is eliminated. The elimination becomes possible in a case that the conductive layer 32 in FIG. 14 is the conductive layer 32b having the above-mentioned moisture-resistant property, or the anti-reflection film 35 comprises PET on which an anti-reflection layer is formed even though the conductive layer 32 does not have a moisture-resistant property.

Figure 16:
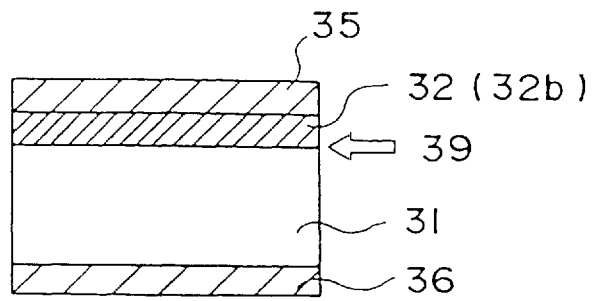
FIG. 16 is a cross-sectional diagrammatical view of an embodiment of the protective plate for PDP of the present invention.

FIG. 16 is a cross-sectional diagrammatical view of another embodiment of the protective plate for PDP of the present invention. In this embodiment, the near infrared ray shielding function of the near infrared ray shielding resinous film 34 in FIG. 11 is accomplished by a self-adhesive 39 added with a near infrared ray absorber instead. FIG. 16 shows an embodiment in which the self-adhesive 39 added with a near infrared ray absorber is used to bond the conductive layer 32 and the substrate 31. However, it is possible for self-adhesive or a bonding agent used at the time of laminating films to have a near infrared ray absorbing function besides the example of FIG. 16 (the films can be laminated by heat bonding without using a self-adhesive or a bonding agent).

Figure 17:
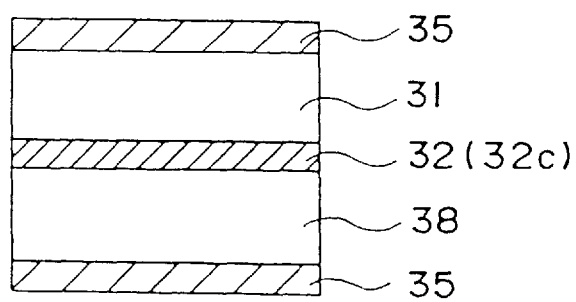
FIG. 17 is a cross-sectional diagrammatical view of an embodiment of the protective plate for PDP of the present invention.

FIG. 17 is a cross-sectional diagrammatical view of another embodiment of the protective plate for PDP of the present invention showing that the conductive layer 32 is embedded in the substrate.

Figure 18:
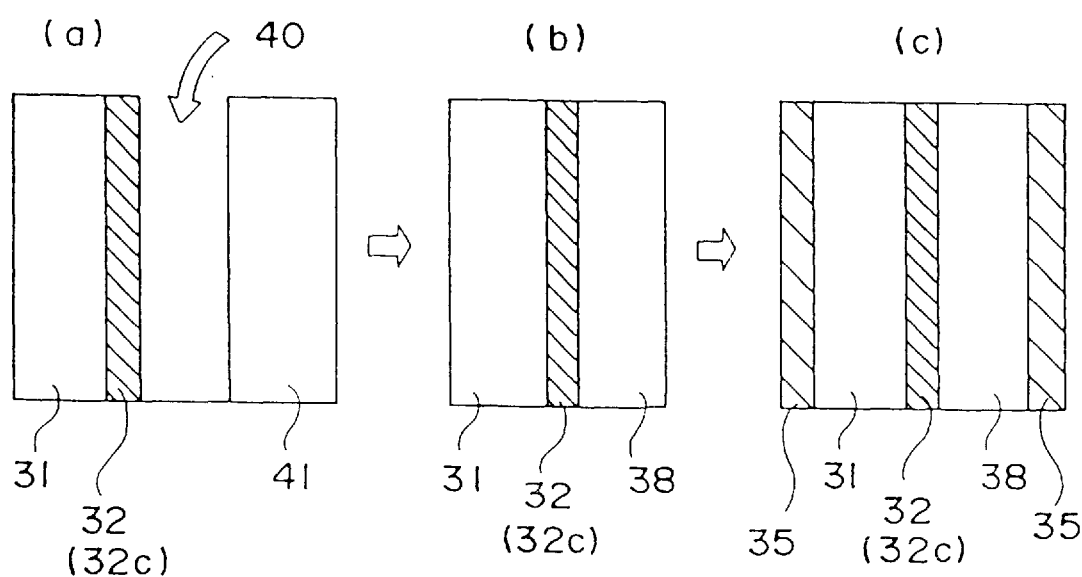
FIG. 18 is a cross-sectional diagrammatical view showing a process for producing the protective plate shown in FIG. 17.

FIG. 18 is a cross-sectional diagrammatical view showing a process for manufacturing the protective plate in FIG. 17. The protective plate in FIG. 17 can be produced by a method that (a) introducing a near infrared ray absorbing acrylic resin 40 between the conductive layer 32 adjacent to the substrate 31 and another plate (such as glass) 41, (b) removing the other plate 41 after the acrylic resin is solidified to form a near infrared ray absorbing substrate 38, and (c) forming the anti-reflection film 35 at outer sides.

As the conductive layer 32, there is a conductive mesh 32c (for example, a polyester mesh in which Cu is formed by sputtering) other than the above-mentioned conductive layer 32. The mesh intervals of the conductive mesh 32c is preferably 300 μm or less so that an electromagnetic wave shielding property can be maintained. Further, the conductive mesh 32c is preferable not to hinder a displaying function of PDP.

In all protective plates for PDP of the present invention shown in FIGS. 8 to 17, the electrode 3 (which is not shown in FIGS. 8 to 17) is formed in a peripheral portion so as to accomplish the electromagnetic wave shielding effect of the conductive layer 32 (for grounding) in the same manner as those in FIGS. 1 to 5.

As the electrode 3, there are such one formed by baking a conductive paste, a conductive tape, a conductive paint or the like as described above. Further, the colored ceramic layer 4 for shielding the electrode so as not to be viewed from an observer side can properly be provided.

When the substrate 31 is of glass, it allows the baking of the conductive paste. In particular, a cooled air strengthened glass is advantageous in manufacturing because the conductive paste (and the colored ceramic layer) can be baked at the same time of the strengthening process. When the substrate 31 is not of glass, such heating treatment can not be conducted. Accordingly, it is preferable to form the electrode by using the conductive tape, the conductive coating or the like.

In FIGS. 8 to 17, a position of observer can be determined at either an upper side or a lower side in each of the Figures. However, the position of observes is preferably determined to the lower side (which is the same as in FIG. 1) in each Figures from the viewpoint of easily obtaining the grounding of the conductive layer 32.

When the substrate 31 is of glass (or when there is a possibility that the substrate 38 is scattered) in the protective plates for PDP of the present invention shown in FIGS. 8 to 17, it is preferable that at least one of the moisture-resistant film 33, the near infrared ray shielding resinous film 34 and the anti-reflection film 35 has an anti-scattering function. Such film having an anti-scattering function may be urethane or PET.

In a case that the substrate 31 is made of plastics (resin) in the protective plates for PDP of the present invention shown in FIGS. 8 to 17, a warp may take place due to a temperature difference between a front surface at a PDP side and the opposite side. However, such warp can be suppressed by ventilation (air flow).

In the protective plates for PDP of the present invention shown in FIGS. 8 to 17, the moisture-resistant film 33, the near infrared ray shielding resinous film 34 and the anti-reflection film 35 may be of colored films to adjust the color tone.

For example, when the conductive film of the conductive layer 32 is a film containing Ag, the conductive film may be seen to be colored depending on film-designing of film thickness and so on. In this case, an anti-reflection film or the like is used as a film of complementary color whereby the overall color tone can be neutralized. Further, depending on a near infrared ray absorber, the near infrared ray shielding resinous film 34 or the near infrared ray absorbing substrate 38 or the like is seen to be colored. In this case too, the same effect is obtainable by using another film as a complementary color film. Since urethane is easily colored in comparison with PET, it is preferred to use it as a colored film.

For example, when the conductive layer 32a having a near infrared ray reflecting function is a conductive film formed by laminating alternately an oxide, Ag, an oxide into 7 layers or more in FIG. 10, such conductive film tends to be colored.

In FIG. 10, the anti-reflection film 35 and the anti-reflection film 36 are used. In this case, it is preferable that the anti-reflection film 35 or the anti-reflection film 36 is so made that an anti-reflection layer is formed on a urethane film of complementary color to the color of the conductive film (in particular, the urethane film of ARCTOP manufactured by Asahi Glass Company Ltd., is used for complementary color).

Further, in FIG. 12, when the conductive layer 32a having a near infrared ray reflecting function is a colored conductive film formed by laminating alternately an oxide, Ag, an oxide into 7 layers, and the anti-reflection film 35 functions as a moisture-resistant film and comprises PET on which an anti-reflection layer is formed, it is preferable that the anti-reflection film 36 comprises an urethane film of complementary color to the color of the conductive layer, on which an anti-reflection layer is formed (in particular, an urethane film of ARCTOP by Asahi Glass Company Ltd. is used for complementary color).

Further, in FIG. 15, when the near infrared ray absorbing substrate 38 or the like is colored by adding a near infrared ray absorber, and when the conductive layer 32 comprising the electric conductive film produced by forming the conductive film on PET which is bonded so that the conductive film is positioned between the infrared ray absorbing substrate 38 and the resinous film is used, it is preferable that the anti-reflection film 35 or the anti-reflection film 36 is so formed that an anti-reflection layer is formed on an urethane film of complementary color to the color of the conductive layer (in particular, an urethane film of ARCTOP by Asahi Glass Company Ltd. is used for complementary color), instead of coloring such PET.

EXAMPLE

Example 1

The example will be described with reference to FIG. 1. A glass plate (substrate 1) was cut to have a necessary size followed by chamfering, washing, screen-printing with ink for the colored ceramic layer 4 on the entire periphery of the glass plate as shown in FIG. 3, and drying sufficiently. Then, a silver paste for the electrode 3 was screen-printed on the entire periphery of the glass plate as shown in FIG. 3, and the silver paste was dried. Then, the glass was heated to 660° C., and then, cooled air strengthening was conducted for the purposes of the baking of the ink and the paste and the strengthening of the glass.

On the surface of the thus prepared glass plate on which the electrode 3 was formed, a transparent conductive film (the conductive film 2) was formed by the method described below (the first step).

Namely, the above-mentioned glass plate was set in a sputtering apparatus, and air is discharged to an order of $10^{-6}$ Torr. Then, a multi-conductive film of glass/3Al—ZnO (40 nm)/2.5Pd—Ag (15 nm)/3Al—ZnO (80 nm)/2.5Pd—Ag (15 nm)/3Al—ZnO (40 nm) was formed. The film-forming condition for each film is described in Table 1.

3Al—ZnO means ZnO containing Al of 3 atomic % based on the sum of Al and Zn, and 2.5Pd—Ag means Ag containing Pd of 2.5 atomic % based on the sum of Pd and Ag. The same applies others.

A result of the measurement of the sheet resistance and the visible light transmittance of the multi-layer conductive film is shown in Table 3.

Then, the film 5 (ARCTOP by Asahi Glass Company Ltd.) was prepared by providing an anti-reflection layer of low refractive index made of a fluorine-containing polymer of non-crystallization on a side surface of a polyurethane type flexible resinous film (200 µm thick). An acryl type adhesive tape (the thickness of an adhesive: about 20 µm) with a parting film was laminated on the surface of the film 15, on which the anti-reflection layer is not formed (hereinbelow, referred to as a specified fluorine film with an anti-reflection layer).

The parting film was peeled off and the near infrared ray shielding resinous film 6 (a film comprising a polyester film of 50 µm thick on which a near infrared ray absorbing layer formed by mixing 5% of near infrared ray absorber (SIR159 by Mitsui Toatsu Kagaku K.K.) in an acrylic resin) was laminated by interposing the acryl type adhesive tape. Then, the same acryl type adhesive tape with a parting film (the thickness of an adhesive: about 20 µm) was laminated on the near infrared ray shielding resinous film 6. The parting film was peeled off, and the tape was bonded to a surface of the glass with the conductive film by means of a roller of silicone rubber having a rubber hardness of 70 (the second step).

The same ARCTOP (the resinous film 5 for preventing scattering and reflection) was bonded to the opposite surface of the glass by interposing the same acryl type adhesive tape so that the anti-reflection layer faced outside whereby the protective plate of the present invention was prepared (the third step). As a result, both the outermost surfaces of the protective plate constituted the anti-reflection layers of ARCTOP.

The thus prepared protective plate underwent the measurement of the sheet resistance and the visible light transmittance. Further, destruction tests (according to JIS R3211) were conducted. A result is shown in Table 3. In Table 3, a mark ○ indicates protective plates without the scattering of glass pieces and having very high safety in the result of the destruction tests.

Figure 6:
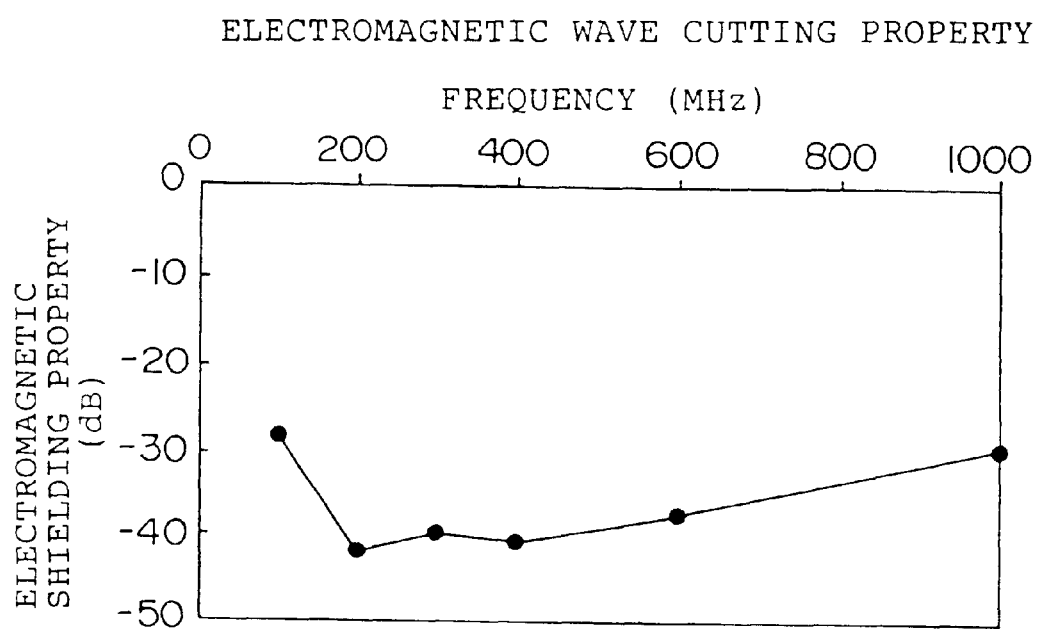
FIG. 6 is a graph showing an electromagnetic shielding property of the protective plate according to the first embodiment.

Further, the electromagnetic wave shielding property was good as shown in FIG. 6. Further, the near infrared ray transmittance was less than 5% in 800–850 nm and less than 10% in 850–1100 nm, each showing sufficient shielding property.

Example 2

Two glass plates were cut to be a necessary size, and chamfering operations were conducted to the edge surfaces. To one (substrate 7) of them, a cutout was formed to obtain a position where a terminal for grounding the electrode was formed. To the other glass plate (substrate 1), washing, screen-printing of ink for the colored ceramic layer on the entire periphery of the glass plate as shown in FIG. 3 and sufficiently drying were conducted in the same manner as in Example 1. Thereafter, a silver paste for the electrode was screen-printed on the entire periphery of the glass plate as shown in FIG. 3, and the glass plate was dried.

Then, the glass was heated to 600° C. to bake the ink and the paste. Then, it was annealed to the room temperature. The same transparent conductive film (conductive film) as Example 1 was formed by sputtering on the surface of the glass plate thus formed on which the electrode was formed. Then, the glass plate (substrate 1) was overlaid onto the originally prepared glass plate (substrate 7) by interposing a polyvinylbutyral film (interlayer film) followed by vacuum press bonding and heat press bonding for a lamination processing.

Then, the parting film of the specified fluorine type film with an anti-reflection layer was peeled off, and it was bonded to both outer surfaces of the lamination glass with the transparent conductive film thus prepared, by means of a roller of silicone rubber having a rubber hardness of 70.

The same evaluation as Example 1 was conducted to the protective plate thus prepared. The electromagnetic wave shielding property was good in the same manner as Example 1. Further, the near infrared ray shielding property was sufficient although it was slightly inferior to that of Example 1.

Example 3

Two glass plates were cut off to be a necessary size, and chamfering operations were conducted to the edge surfaces. To one (substrate 1) of them, washing, was conducted and screen-printing of ink for the colored ceramic layer was conducted on the entire periphery of the glass plate as shown in FIG. 3, and drying sufficiently in the same manner as Example 1. Then, a silver paste for the electrode was screen-printed on the entire periphery of the glass plate as shown in FIG. 3, followed by drying. To the other glass plate (substrate 7), the silver paste for the electrode was screen-printed on the entire periphery of the glass plate and the glass plate was dried in the same manner as substrate 1. No colored ceramic layer was formed.

Both the glass plates (substrate 1 and substrate 7) were heated to a glass temperature of 600° C. to bake the ink and the paste, and they were annealed to the room temperature. The same transparent conductive film (conductive film) as that of Example 1 was formed by sputtering on a surface of each of glass plates thus prepared, where the electrode was formed. Then, these glass plates (substrate 1 and substrate 7) were overlaid with the conductive films facing inside by interposing a polyvinylbutyral film (interlayer film), followed by vacuum press bonding and heat press bonding for lamination.

Then, the parting film of the specified fluorine type film with an anti-reflection layer was peeled off, and it was bonded to both outer surfaces of the lamination glass with the transparent conductive film thus prepared, by means of a roller of silicone rubber having a rubber hardness of 70.

The same evaluation as Example 1 was conducted to the protective plate thus prepared. The electromagnetic wave shielding property was extremely higher than that of Example 1. The near infrared ray shielding property was superior to that of Example 2.

Example 4

A glass plate with a transparent conductive film was prepared in the same manner as Example 1 except that the transparent conductive film shown in Table 2 was formed. The film-forming condition of each film was as in Table 1.

In Table 1, 5Al—ZnO means ZnO containing 5 atomic % of Al based on the sum of Al and Zn, and ZrSi N means a composite nitride (Zr:Si=1:2) of Zr and Si. In Table 2, "G" means a glass plate, and figures described in brackets indicate a geometrical film thickness (nm).

A result of the measurement of the sheet resistance and the visible light transmittance of the multi-layer conductive film is shown in Table 3.

A protective plate of the present invention was prepared in the same manner as Example 1 except that the near infrared ray shielding resinous film 6 was not used. Table 3 shows a result of evaluation on the obtained protective plate, in the same manner as Example 1. It showed an excellent near infrared ray shielding property although it had no near infrared ray shielding resinous film 6. Further, the visible light reflectivity was lower than that of Example 1 having two layers of Ag.

TABLE 1

| Film | Target | Introduced gas (flow ratio) | Pressure (mTorr) | Input power (W/cm$^2$) |
| --- | --- | --- | --- | --- |
| 5Al—ZnO | 5Al—Zn | O$_2$ (100%) | 2 | 3.6 |
| 3Al—ZnO | 3Al—Zn | O$_2$ (100%) | 2 | 3.6 |
| SnO$_2$ | Sn | O$_2$ (100%) | 2 | 3.6 |
| 1Pd—Ag | 1Pd—Ag | Ar (100%) | 2 | 0.8 |
| 2.5Pd—Ag | 2.5Pd—Ag | Ar (100%) | 2 | 0.8 |
| Ti | Ti | Ar (100%) | 2 | 1.5 |
| ZrSi$_x$N$_y$ | ZrSi (1:2) | Ar/N$_2$ (=1/3) | 2 | 5.5 |
| GZSO | GZSO | Ar | 2 | 3.6 |

Example 5

A glass plate with a transparent conductive film was prepared in the same manner as Example 1 except that the transparent conductive film shown in Table 2 was formed. The film-forming condition of each film is as in Table 1.

In Table 1, GZSO is such one containing 5.4% by weight of Ga$_2$O$_3$, 0.1% by weight of SiO$_2$ and 94% by weight of ZnO based on the sum of Ga$_2$O$_3$, SiO$_2$ and ZnO, which was used as an oxide barrier layer.

A result of the measurement of the sheet resistance and the visible light transmittance of the multi-layer conductive film is shown in Table 3.

In the next, the protective plate of the present invention was prepared in the same manner as Example 1 except that the near infrared ray shielding resinous film 6 was not used. A result obtained by conducting the same evaluation as Example 1 is shown in Table 3. It showed superior near infrared ray shielding property although it did not have the near infrared ray shielding resinous film 6.

Example 6

A glass plate with a transparent conductive film was prepared in the same manner as Example 1.

Then, the parting film of the specified fluorine type film with an anti-reflection layer was peeled off, and a moisture-resistant film 33 (a film obtained by coating polyvinylidene chloride on a polyester film of 12 μm thick (tradename: "Cenessy" manufactured by Daicel Chemical K.K.) was bonded by interposing an acryl type adhesive tape. Then, the same acryl type adhesive tape with a parting film (the thickness of an adhesive: about 20 μm) was laminated on the moisture-resistant film 33. The parting film was peeled off, and it was bonded to a coating surface of the glass with the conductive film by means of a roller of silicone rubber having a rubber hardness of 70.

In a similar manner, bonding operations were conducted such that ARCTOP (visible light transmittance: 83%) colored to reddish purple which was formed by adding a coloring agent into an urethane resin for the purpose of correcting the color of the conductive film, was attached to the opposite surface of the glass by interposing the same acryl type adhesive tape with a parting film as described above so that the anti-reflection layer faces outside, whereby the protective plate of the present invention as shown in FIG. 10 was prepared (both the outermost surfaces of the protective plate constitute anti-reflection layers of ARCTOP).

In the protective plate prepared, a color resulted from silver sputtering disappeared by using the colored ARCTOP whereby a color closer to the color of the device could be reproduced. Accelerated deterioration tests were conducted on the durability at 60° C. in an atmosphere of 90%. Conventionally, there was found the deterioration of silver due to oxidation after about 100 hours. However, in this example having such construction, there was found no change in appearance even after 500 hours.

A result obtained by conducting the same evaluation as in Example 1 on the obtained protective plate is shown in Table 3. The electromagnetic wave shielding property was good as shown in FIG. 6. Further, the near infrared ray transmittance was less than 5% in 800–850 nm and less than 10% in 850–1100 nm, which showed sufficient shielding property respectively.

Example 7

A glass plate with a transparent conductive film was prepared in the same manner as Example 1 except that the transparent conductive film shown in Table 2 was formed. The film-forming condition of each film is as in Table 1.

A result by the measurement of the sheet resistance and the visible light transmittance of the multi-layer conductive film is shown in Table 3.

A protective plate of the present invention was prepared in the same manner as Example 1. A result of evaluation on the obtained conductive plate in the same manner as Example 1 is shown in Table 3. The electromagnetic wave shielding property was good as shown in Table 6. The near infrared ray transmittance was less than 5% in 800–850 nm, and less than 10% in 850–1100 nm, which showed sufficient shielding property respectively.

Example 8

A glass plate with a transparent conductive film was prepared in the same manner as Example 7 except that the transparent conductive film shown in Table 2 was formed. The film-forming condition of each film is as in Table 1.

A result of the measurement of the sheet resistance and the visible light transmittance of the multi-layer conductive film is shown in Table 3.

A protective plate of the present invention was prepared in the same manner as Example 7 except that the near infrared ray shielding resinous film 6 was not used. A result of the evaluation on the obtained protective plate in the same manner as Example 1 is shown in Table 3. It showed excellent near infrared ray shielding performance even though it did not have the near infrared ray resinous film 6.

Example 9

A glass plate with a transparent conductive film was prepared in the same manner as Example 7 except that the transparent conductive film shown in Table 2 was formed. The film-forming condition of each film is as in Table 1.

A result of the measurement of the sheet resistance and the visible light transmittance of the multi-layer conductive film is shown in Table 3.

A protective plate of the present invention was prepared in the same manner as Example 7 except that the near infrared ray shielding resinous film 6 was not used. A result of the evaluation as Example 1 on the obtained protective plate is shown in Table 3. It showed excellent near infrared ray shielding property although it did not have the near infrared ray shielding resinous film 6.

Example 10

A glass plate with a transparent conductive film was prepared in the same manner as Example 7 except that the transparent conductive film shown in Table 2 was formed. The film-forming condition of each film is as in Table 1.

A result of the measurement of the sheet resistance and the visible light transmittance of the multi-layer conductive film is shown in Table 3.

A protective plate of the present invention was prepared in the same manner as Example 1 except that the near infrared ray shielding resinous film 6 was not used. A result obtained by conducting the same evaluation as Example 1 on the obtained protective plate is shown in Table 3. It showed excellent near infrared ray shielding property although it did not have the near infrared ray shielding resinous film 6.

Example 11

A glass plate with a transparent conductive film was prepared in the same manner as Example 7 except that the transparent conductive film shown in Table 2 was formed. The film-forming condition of each film is as in Table 1.

A result of the measurement of the sheet resistance and the visible light transmittance of the multi-layer conductive film is shown in Table 3.

A protective plate of the present invention was prepared in the same manner as Example 1 except that the near infrared ray shielding resinous film 6 was not used. A result obtained by conducting the same evaluation as Example 1 on the obtained protective plate is shown in Table 3. It showed excellent near infrared ray shielding property although it did not have the near infrared ray shielding resinous film 6. Further, the width of wavelength capable of maintaining a low reflection was wider than that of Example 9 or 10.

Example 12

A glass plate with a transparent conductive film was prepared in the same manner as Example 7 except that the transparent conductive film shown in Table 2 was formed. The film-forming condition of each film is as in Table 1.

A protective plate of the present invention was prepared in the same manner as Example 7 except that a polyethylene terephthalate (PET) film (200 μm thick) was used instead of the near infrared ray shielding resinous film 6. As a result of the same evaluation as Example 1 on the obtained protective plate, the sheet resistance was 2.5 Ω/□ and the visible light transmittance was 60%. Further, the electromagnetic wave shielding property was good as shown in FIG. 6. The near infrared transmittance was less than 5% in 800–850 nm and less than 10% in 850–1100 nm, which showed sufficient shielding property respectively.

A protective plate of the present invention was prepared in the same manner as the above except that the PET film was not used.

As humidity tests, protective plates were placed in a vessel of high temperature and humidity of 60° C. and 95% for 1000 hours. As a result, there was found no change in appearance on the protective plate having the PET film, and on the other hand, the visible light reflectivity was increased on the protective plate without having the PET film, and the reflection color was changed to a reddish tone.

Example 13

A glass plate with a transparent conductive film was prepared in the same manner as Example 6 except that the transparent conductive film shown in Table 2 was formed, and further, a protective plate of the present invention was prepared in the same manner as Example 6 (both outermost surfaces of the protective plate constitute anti-reflection layers of ARCTOP).

A result obtained by conducting the same evaluation as Example 1 on the obtained protective plate is shown in Table 3. The near infrared ray transmittance was less than 5% in 800–850 nm and less than 10% in 850–1100 nm, which showed sufficient shielding property respectively.

TABLE 2

| Ex. | Film structure |
|-----|----------------|
| 1 | G/3Al—ZnO(40)/2.5Pd—Ag(15)/3Al—ZnO(80)/2.5Pd—Ag(15)/3Al—ZnO(40) |
| 4 | G/5Al—ZnO(40)/2.5Pd—Ag(10)/Ti(2)/5Al—ZnO(80)/2.5Pd—Ag(11.5)/Ti(2)/5Al—ZnO(80)/2.5Pd—Ag(10)/Ti(2)/5Al—ZnO(30)/ZrSi$_x$N$_y$(10) |
| 5 | G/5Al—ZnO(40)/1Pd—Ag(10)/GZSO(5)/5Al—ZnO(75)/1Pd—Ag(11.5)/GZSO(5)/5Al—ZnO(75)/1Pd—Ag(10)/GZSO(5)/5Al—ZnO(25)/ZrSi$_x$N$_y$(10) |
| 7 | G/3Al—ZnO(32)/1Pd—Ag(10)/3Al—ZnO(78)/1Pd—Ag(10)/3Al—ZnO(32) |
| 8 | G/5Al—ZnO(40)/1Pd—Ag(10)/Ti(2)/5Al—ZnO(80)/1Pd—Ag(11)/Ti(2)/5Al—ZnO(80)/1Pd—Ag(10)/Ti(2)/5Al—ZnO(30)/ZrSi$_x$N$_y$(10) |
| 9 | G/5Al—ZnO(40)/1Pd—Ag(10.5)/Ti(2)/5Al—ZnO(85)/1Pd—Ag(12.5)/Ti(2)/5Al—ZnO(85)/1Pd—Ag(10.5)/Ti(2)/5Al—ZnO(30)/ZrSi$_x$N$_y$(10) |

TABLE 2-continued

| Ex. | Film structure |
|---|---|
| 10 | G/5Al—ZnO(40)/1Pd—Ag(11)/Ti(2)/5Al—ZnO(85)/1Pd—Ag(15)/Ti(2)/5Al—ZnO(85)/1Pd—Ag(11)/Ti(2)/5Al—ZnO(30)/ZrSi$_x$N$_y$(10) |
| 11 | G/5Al—ZnO(41)/1Pd—Ag(11)/Ti(2)/5Al—ZnO(80)/1Pd—Ag(14)/Ti(2)/5Al—ZnO(78)/1Pd—Ag(14)/Ti(2)/5Al—ZnO(72)/1Pd—Ag(11)/Ti(2)/5Al—ZnO(12)/ZrSi$_x$N$_y$(10) |
| 13 | G/5Al—ZnO(13)/SnO$_2$(14)/5Al—ZnO(13)/1Pd—Ag(11)/GZSO(5)/5Al—ZnO(25)/SnO$_2$(25)/5Al—ZnO(25)/1Pd—Ag(11)/GZSO(5)/5Al—ZnO(25)/SnO$_2$(25)/5Al—ZnO(25)/1Pd—Ag(11)/GZSO(5)/5Al—ZnO(17)/SnO$_2$(18) |

TABLE 3

| | Example 1 | Example 2 | Example 3 | Example 4 | Example 5 | Example 6 | Example 7 |
|---|---|---|---|---|---|---|---|
| (Multi-layer conductive film) | | | | | | | |
| Sheet resistance (Ω/□) | 3.5 | 3.5 | 3.5 | 2.5 | 2.5 | 3.5 | 4.0 |
| Visible light transmittance (%) | 75.2 | 75.2 | 75.2 | 67.0 | 68.0 | 75.2 | 74.0 |
| (Protective plate) | | | | | | | |
| Sheet resistance (Ω/□) | 3.5 | 3.5 | 1.75 | 2.5 | 2.5 | 3.5 | 4.0 |
| Visible light transmittance (%) | 70.0 | 70.0 | 53.0 | 59.0 | 59.0 | 60.0 | 70.0 |
| Transmission color (x, y) | (0.3010, 0.3170) | (0.3010, 0.3170) | (0.3130, 0.3260) | (0.3009, 0.3100) | (0.3000, 0.3110) | (0.3000, 0.3160) | (0.3015, 0.3118) |
| Visible light reflectance (%) | 1.9 | 1.9 | 3.0 | 1.8 | 1.9 | 2.0 | 2.2 |
| Reflection color (x, y) | (0.2770, 0.2050) | (0.2770, 0.2050) | (0.2205, 0.2310) | (0.2771, 0.2263) | (0.2100, 0.2510) | (0.2783, 0.2060) | (0.2516, 0.2190) |
| Infrared ray (900 nm) transmittance (%) | 4.0 | 4.0 | 0.2 | 2.5 | 2.5 | 3.5 | 5.0 |
| Destruction test (JIS R3211) | ○ | ○ | ○ | ○ | ○ | ○ | ○ |

| | Example 8 | Example 9 | Example 10 | Example 11 | Example 13 |
|---|---|---|---|---|---|
| (Multi-layer conductive film) | | | | | |
| Sheet resistance (Ω/□) | 2.5 | 2.0 | 1.5 | 1.5 | 2.4 |
| Visible light transmittance (%) | 68.0 | 64.0 | 59.0 | 59.0 | 68.0 |
| (Protective plate) | | | | | |
| Sheet resistance (Ω/□) | 2.5 | 2.0 | 1.5 | 1.5 | 2.4 |
| Visible light transmittance (%) | 59.0 | 56.0 | 63.0 | 63.0 | 57.0 |
| Transmission color (x, y) | (0.2998, 0.3112) | (0.2974, 0.3031) | (0.3109, 0.3494) | (0.3065, 0.3232) | (0.3010, 0.3060) |
| Visible light reflectance (%) | 1.9 | 2.1 | 2.5 | 2.1 | 1.9 |
| Reflection color (x, y) | (0.2105, 0.2513) | (0.2665, 0.2854) | (0.2249, 0.2092) | (0.3428, 0.2933) | (0.2700, 0.2904) |
| Infrared ray (900 nm) transmittance (%) | 2.5 | 3.3 | 1.0 | 0.8 | 4.0 |
| Destruction test (JIS R3211) | ○ | ○ | ○ | ○ | |

INDUSTRIAL APPLICABILITY

The protective plate of the present invention has an electromagnetic wave shielding effect and a near infrared ray shielding effect. Further, a film for preventing scattering is attached to a surface or the formation of lamination glass eliminates the scattering of glass pieces even though the glass is broken. Further, an anti-reflection film is bonded to or a film of low refractive index is formed on each surface of the protective plate of the present invention whereby an anti-reflection treatment is conducted. Accordingly, there is no difficulty in seeing the picture surface of PDP because of an interior illumination.

Obviously, numerous modifications and variations of the present invention are possible in light of the above teachings. It is therefore to be understood that within the scope of the appended claims, the invention may be practiced otherwise than as specifically described herein.

What is claimed is:

1. A protective plate for a plasma display comprising a conductive plate and an electrode in electrical contact with the conductive plate,
   the conductive plate comprising a substrate and a conductive film formed on the substrate,
   wherein the conductive film is a multi-layer conductive film,
   wherein an oxide layer and a metal layer are laminated alternately from a substrate side to form in total (2n+1) layers (wherein n is an integer of at least 1), and
   wherein the oxide layer comprises ZnO as the main component,
   wherein the oxide layer comprises at least one metal.

2. The protective plate according to claim 1, wherein the proportion of the total amount of the at least one metal is within 1–10 atomic % based on the sum of the total amount of the metal and Zn.

3. The protective plate according to claim 2, wherein the metal comprises at least one metal selected from the group consisting of Sn, Al, Cr, Ti, Si, B, Mg and Ga.

4. The protective plate according to claim 3, wherein the metal layer comprises Ag as the main component.

5. The protective plate according to claim 4, wherein the metal layer comprises at least one metal selected from the group consisting of Pd and Au.

6. The protective plate according to claim 5, wherein the proportion of the total amount of the metal selected from the group consisting of Pd and Au is within 0.3–10 atomic % based on the sum of Ag and the total amount of the metal selected from the group consisting of Pd and Au.

7. The protective plate according to claim 1, wherein a film of low refractive index is provided on at least one surface of the substrate, whereby an anti-reflection property is provided, and wherein the film of low refractive index is a colored film of a complementary color selected to neutralize an overall color tone.

8. A protective plate for a plasma display comprising a conductive plate and an electrode in electrical contact with the conductive plate, the conductive plate comprising a substrate and a conductive film formed on the substrate, wherein the conductive film is a multi-layer conductive film, wherein an oxide layer and a metal layer are laminated alternately from a substrate side to form in total (2n+1) layers (wherein n is an integer of at least 1), wherein the conductive film is a multi-layer conductive film in which an oxide layer and a metal layer are alternately laminated into 7 layers, and wherein the second, fourth, and sixth layers are metal, and the thickness of the fourth layer in the conductive film is larger than that of the second layer and is larger than that of the sixth layer.

9. The protective plate according to claim 8, wherein a moisture-proof film is provided and is a colored film of a complementary color selected to neutralize an overall color tone.

* * * * *